United States Patent
Wilson et al.

(12)

(10) Patent No.: US 6,268,653 B1
(45) Date of Patent: Jul. 31, 2001

(54) SEMICONDUCTOR LASER DIODE MULTI-CHIP MODULE

(75) Inventors: Stewart Wayne Wilson; Rushikesh M. Patel; Shantanu Gupta, all of Tucson, AZ (US)

(73) Assignee: Opto Power Corporation, Tucson, AZ (US)

(*) Notice: Subject to any disclaimer, the term of this patent is extended or adjusted under 35 U.S.C. 154(b) by 0 days.

(21) Appl. No.: 09/262,617

(22) Filed: Mar. 4, 1999

(51) Int. Cl.[7] .................................................. H01L 23/053
(52) U.S. Cl. ............................................. 257/700; 257/729
(58) Field of Search ..................................... 257/700–712, 257/675, 718, 719, 729; 938/106, 109

(56) References Cited

U.S. PATENT DOCUMENTS 5,043,775 * 8/1991 Lee ........................................ 357/438
5,913,108 * 11/1999 Stepehens et al. ................... 438/109
5,985,684 * 11/1999 Marshall et al. ....................... 438/26

* cited by examiner

*Primary Examiner*—Roy Potter
(74) *Attorney, Agent, or Firm*—Herbert M. Shapiro

(57) ABSTRACT

A substrate comprising, for example, a copper-beryllium oxide ceramic-copper sandwich permits a laser diode along with cooperative components to be soldered in place using a high temperature solder. The sandwich structure is operative to move the effective thermal properties of the copper more towards that of the beryllium oxide thus reducing, for example, any stress which might occur between the solder, the substrate, and the laser diode. The use of high temperature solder provides for significantly improved operation.

6 Claims, 5 Drawing Sheets

SEMICONDUCTOR LASER DIODE MULTI-CHIP MODULE

FIELD OF THE INVENTION

This invention relates to high power, semi-conductor, laser diodes and, more particularly, to a stress-reduced packaging arrangement for such diodes.

BACKGROUND OF THE INVENTION

High power laser diodes are commercially available. A failure mode for such diodes is traceable to stress introduced by the solder used to mount the diodes on a suitable substrate. In order to avoid stress, low temperature solders are used. But low temperature solders constrains the power output which could otherwise be significantly higher. Much higher power output could be obtained if the diodes could be mounted with high temperature solders. Unfortunately, the stress induced by the high temperature solders lead to unacceptable device failures.

BRIEF DESCRIPTION OF THE INVENTION

In accordance with the principles of this invention, a laser diode is bonded to a substrate structured to permit high temperature solder to be used to affix the diode. The substrate is made from several layers comprising copper beryllium oxide-copper in a lamellate structure which results in the copper exhibiting thermal expansion properties closer to that of beryllium. A high temperature solder is used to bond a laser diode to the copper layer.

In one embodiment, one of the copper layers is formed into discrete areas or islands to which multiple components are soldered, all with high temperature solders, to form a multi-chip module.

DETAILED DESCRIPTION OF ILLUSTRATIVE EMBODIMENTS OF THE INVENTION

Figure 1:
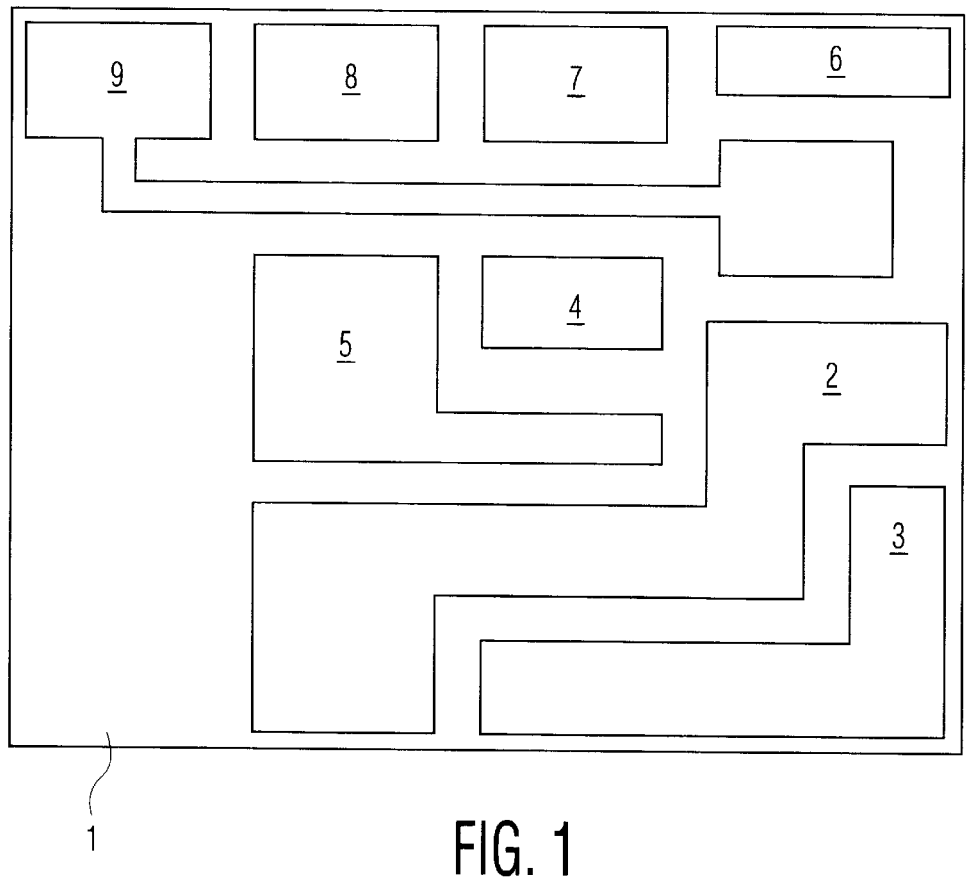
FIGS. 1, 3 and 7 are schematic top views of alternative multi-chip embodiments in accordance with the principles of this invention.

FIG. 1 shows a top view of a multi-chip module using high temperature solder to attach the chips to a substrate (1) in accordance with the principles of this invention. The figure shows a pattern of copper islands designated 2 through 9. The islands designated 2 and 9 are used to attach a laser diode and a thermistor respectively. The remaining islands are for wire bonding connectors as will become clear hereinafter.

Figure 2:
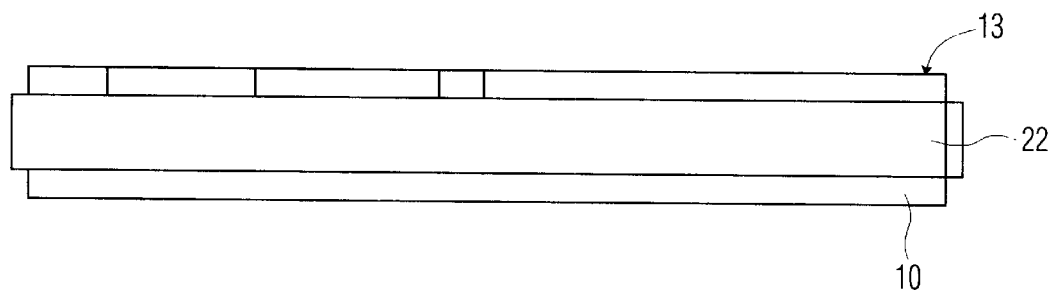
FIGS. 2 and 4 are schematic side views of the embodiments of FIGS. 1 and 3 respectively.

FIG. 2 shows a side view of the structure of FIG. 1. The structure comprises a copper layer 10, a beryllium oxide layer 12 and a copper layer 13 which is patterned as shown in FIG. 1.

The substrate is fabricated by the well known process of attaching metals to ceramics. For example, it is well known that copper can be bonded directly to a ceramic substrate, like beryllium oxide (BEO), by sandwiching a ceramic substrate between two pieces of copper and heating the composite structure to the copper-oxygen eutectic temperature (approximately 1083° Centigrade). A first of the copper layers is patterned, as shown in FIG. 1, using standard photolithography techniques (or laser trimming)., The selection of the ceramic depends on the desired coefficient of thermal expansion (CTE) as well as the thermal conductivity of the material. For a copper thickness of 0.010 inch to 0.015 inch or less, as is desired herein, the CTE of the composite structure is equivalent to that of the ceramic. Accordingly, the CTE of the ceramic is chosen to closely match that of the components (dies) attached to the composite. The proper choice ensures that only insignificant stress is introduced into the resulting module during operation and thus high temperature solders can be used to attach the modules.

The ceramic also should have a high thermal conductivity to provide a desirable thermal path to a heat sink attached to copper layer 10 also by a high temperature solder. A proper chance for the ceramic layer for a laser diode is BeO, AlN, diamond or T-cBN. For a choice of BeO, the copper-BeO-copper composite has thicknesses of 0.010–0.025–0.010 inch as shown in FIG. 2 for layers 13, 12, and 10 respectively.

Figure 3:
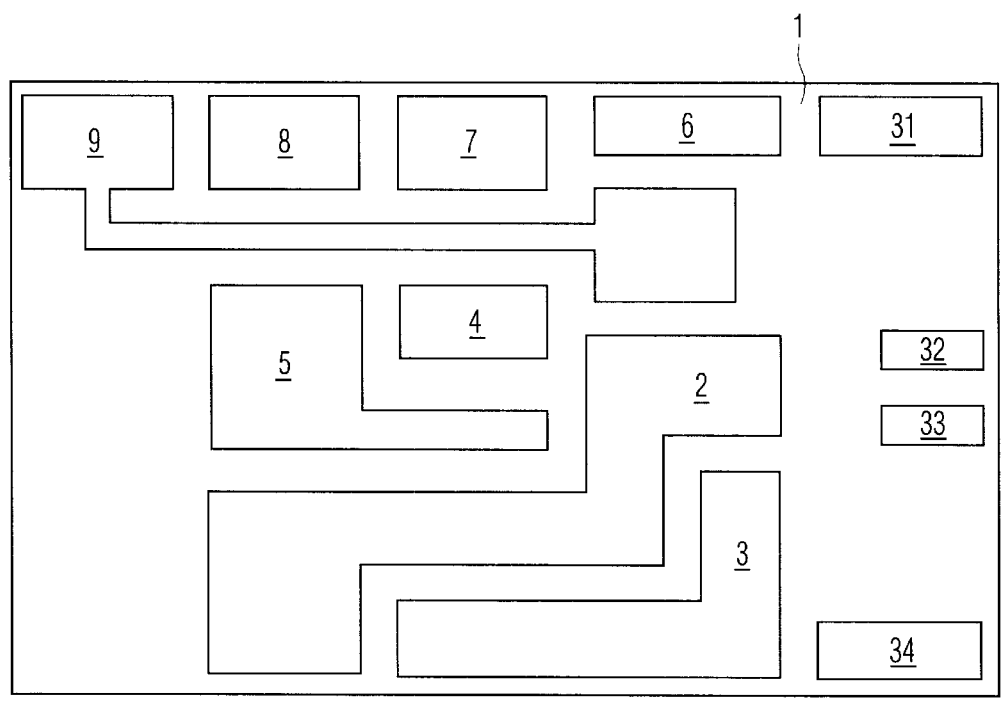
Figure 4:
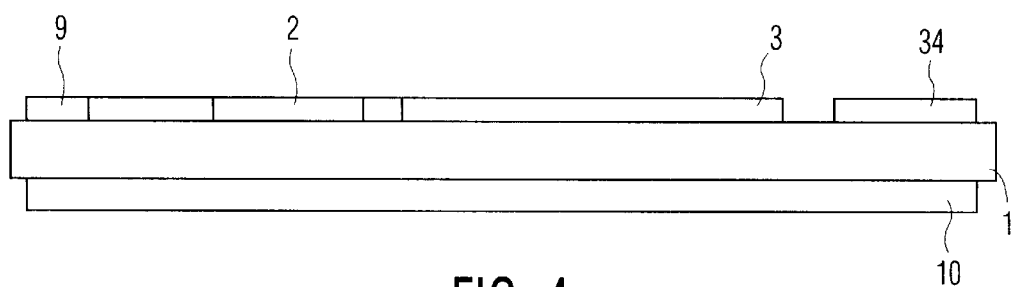

FIGS. 3 and 4 show top and side views of an embodiment similar to that shown in FIGS. 1 and 2 extended to the right as viewed to include copper islands 31, 32, 33 and 34. The remaining islands are designated as they are in FIGS. 1 and 2 for ease of comparison.

Figure 5:
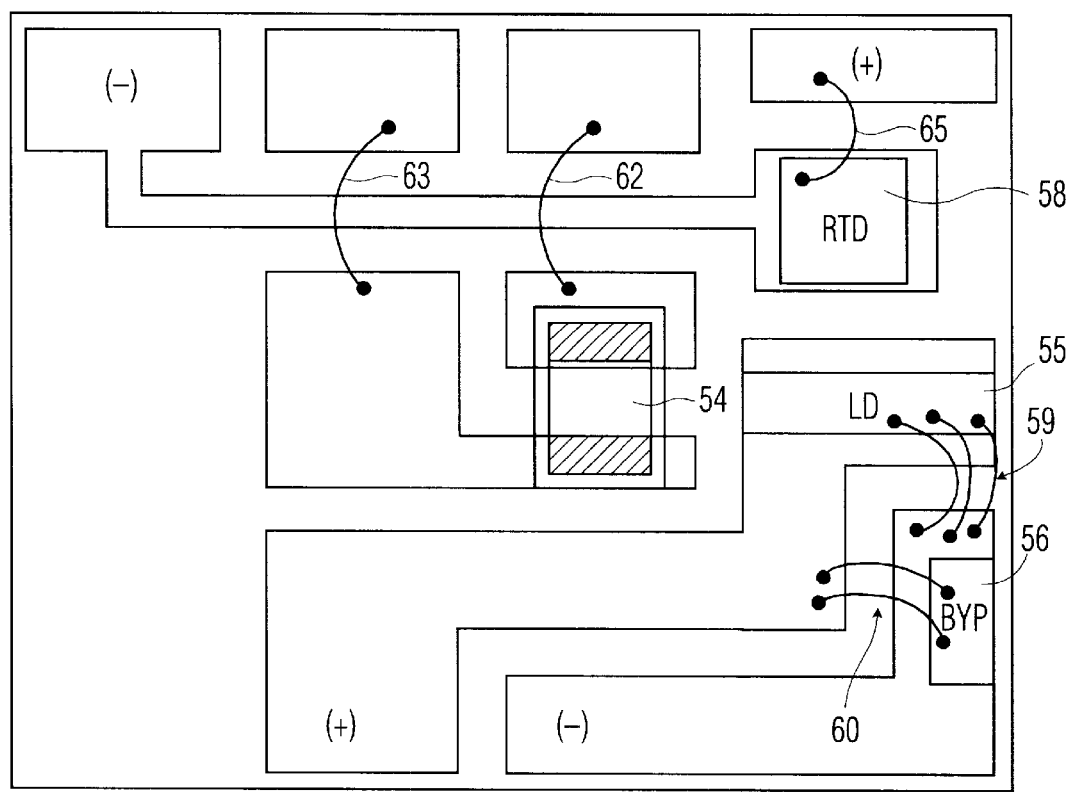
FIG. 5 is a top view of FIG. 3.

FIG. 5 shows a top view of the arrangement of FIG. 3 with components in place and bonded to corresponding copper islands of FIG. 3 all with high temperature solder. Specifically, FIG. 5 shows a photodiode 54 in place between islands 4 and 5 of FIG. 3. FIG. 5 also shows a laser diode 55 bonded to island 2. A bypass (reverse-biased laser diode) 56 is attached to island 3 of FIG. 3. A thermistor 58 is attached to island 9. The laser diode is connected to island 3 by several wire bonds as indicated by arrow 59. The bypass diode also is connected to island 2 by wire bonds at arrow 60. Islands 4 and 5 (to which photodiode 54 is connected) are connected to islands 7 and 8 by wire bonds 62 and 63 respectively. The thermistor (58) is connected to island 6 of FIG. 3 by wire bond 65 which is maintained positive during operation. Island 9 is maintained negative.

Figure 6:
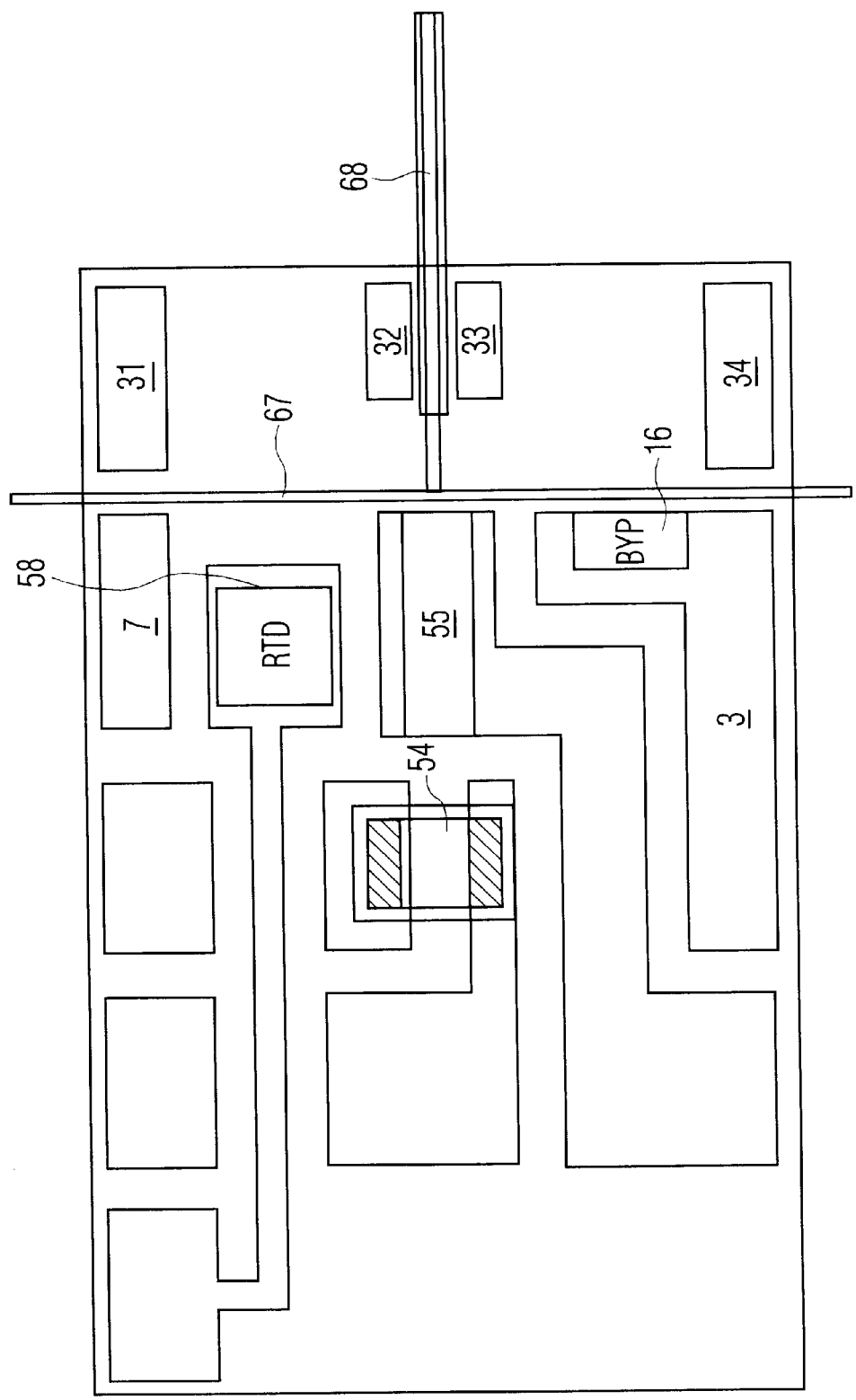
FIG. 6 is a module using the configuation of FIG. 3.

FIG. 6 shows an alternative multi-chip module using the island configuration of FIG. 3. The added island 31, 32, 33, and 34 are used to secure a microlens 67 (between islands 31 and 7 and islands 34 and 3) and to secure optical fiber 68 between islands 32 and 33.

The multi-chip module of FIG. 6 is operative as a conventional laser diode with a bypass laser diode, a thermal sensor (for thermal control) and a rear (facet) photodiode (54). But all components are bonded with high temperature solder to a substrate with a closely matching coefficient of thermal expansion.

Figure 7:
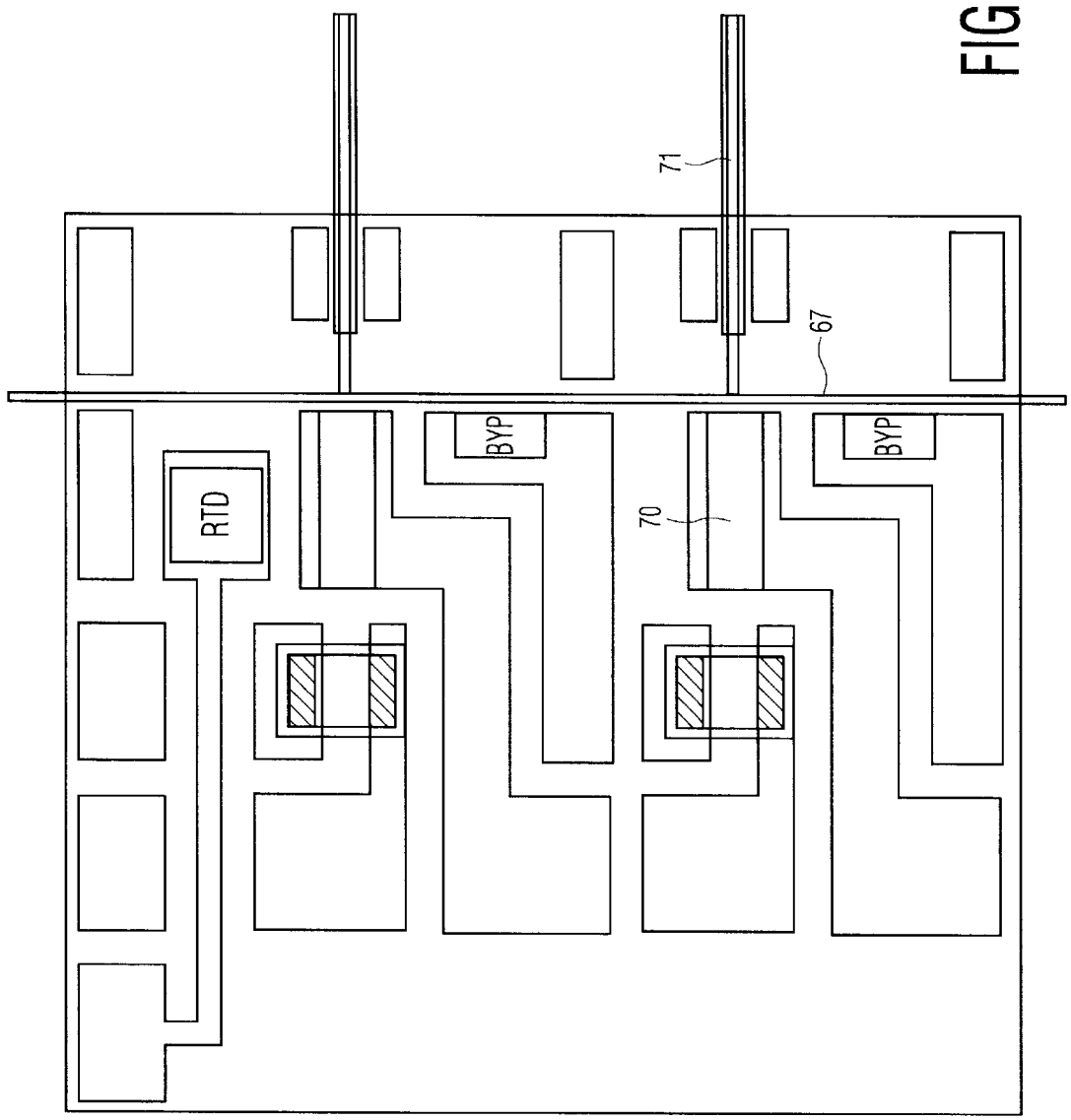

FIG. 7 shows a top view of an arrangement similar to that shown in FIG. 6 except that it includes a second laser diode 70 along with an additional optical fiber 71 coupled to the microlens (67). It is clear that a multi-chip arrangement with more than two laser diodes with associated optical fibers can be made with components bonded to a substrate via high temperature solder in accordance with the principles of this invention.

For the embodiments shown, the high temperature (hard) solder used was 80 Au 20 Sn. The hard solders also are known to be more "creep" resistant than the solders normally used to establish low thermal impedance packaging where indium or indium based solders are used. Further, the use of hard solder permits the realization of a "flux-free" die attach. The absence of flux provides for a relatively high reliability bond because fluxes can degrade optical-related components such as laser facets.

The composite substrate—multi-chip module also has a significantly-increased effective thermal conductivity and hence the overall thermal impedance of the module of FIG. 6 is approximately 7–9 C/W. Laser diode bars may also be packaged using high temperature solders in accordance with the principles of this invention.

What is claimed is:

1. Laser apparatus comprising a laser diode and a substrate to which said diode is mounted, said substrate comprising a ceramic sandwich of copper-beryllium oxide ceramic-copper layers, a first of said copper layers being of a geometry to correspond to said diode, said first copper layer being bonded to said diode via a high temperature solder.

2. Apparatus as in claim 1 wherein a second of said copper layers is bonded to a heat sink.

3. Apparatus as in claim 1 wherein said first copper layer is separated into islands, said islands having geometries to correspond to those of different components.

4. Apparatus as in claim 3 also including a plurality of components soldered to corresponding ones of said islands with a high temperature solder.

5. Apparatus as in claim 2 wherein said second copper layer is bonded to said heat sink with a high temperature solder.

6. A laser package comprising a substrate for bonding a plurality of components thereto, said substrate comprising a lamellate sandwich of copper-BeO-copper layers, a first of said copper layers being patterned to form a plurality of electrically-isolated areas each of said areas having a geometry to mate with a component, a first of said areas corresponding to a laser diode, said components including said laser diode being bonded to the corresponding copper area via a high temperature solder.

* * * * *